US010969590B1

(12) United States Patent
Danziger et al.

(10) Patent No.: US 10,969,590 B1
(45) Date of Patent: Apr. 6, 2021

(54) NEAR-EYE DISPLAY WITH LASER DIODE ILLUMINATION

(71) Applicant: LUMUS LTD., Ness Ziona (IL)

(72) Inventors: Yochay Danziger, Kfar Vradim (IL); Ronen Chriki, Lod (IL); Nitzan Livneh, Mevasseret Zion (IL)

(73) Assignee: Lumus Ltd., Ness Ziona (IL)

( * ) Notice: Subject to any disclaimer, the term of this patent is extended or adjusted under 35 U.S.C. 154(b) by 0 days.

(21) Appl. No.: 16/631,488

(22) PCT Filed: Sep. 8, 2019

(86) PCT No.: PCT/IL2019/051003
§ 371 (c)(1),
(2) Date: Jan. 16, 2020

(87) PCT Pub. No.: WO2020/049574
PCT Pub. Date: Mar. 12, 2020

Related U.S. Application Data

(60) Provisional application No. 62/727,581, filed on Sep. 6, 2018.

(51) Int. Cl.
*G09G 5/00* (2006.01)
*G02B 27/01* (2006.01)
(Continued)

(52) U.S. Cl.
CPC ....... *G02B 27/0172* (2013.01); *G02B 6/4214* (2013.01); *G02B 6/4296* (2013.01);
(Continued)

(58) Field of Classification Search
CPC ............... G02B 6/4214; G02B 6/4296; G02B 27/0172; G02B 2027/0178; H04N 9/3155; H04N 9/3161
See application file for complete search history.

(56) References Cited

U.S. PATENT DOCUMENTS 10,302,835 B2 * 5/2019 Danziger ............. G02B 6/0016
10,481,319 B2 * 11/2019 Danziger ........... G02B 27/0172
(Continued)

FOREIGN PATENT DOCUMENTS

WO  WO-2019111237 A1 * 6/2019 ........... G02B 26/103
WO  WO-2020049574 A1 * 3/2020 ............... G02B 6/10

*Primary Examiner* — Joe H Cheng
(74) *Attorney, Agent, or Firm* — Mark M. Friedman

(57) ABSTRACT

A near-eye display has a light-guide optical element (LOE) with two major parallel external surfaces. An image projector introduces image illumination into the LOE so as to propagate by internal reflection. The image projector includes one or more light-generating laser diode operated by a controller. A coupling-out arrangement includes a set of mutually-parallel, partially-reflective surfaces associated with the LOE at an oblique angle to the major external surfaces for coupling the illumination out of the LOE towards the eye of the observer. The light-generating laser diode has a characteristic variation of coherence length of generated light as a function of diode actuation power. The controller actuates the laser diode at a level of diode actuation power that generates light with a coherence length that is less than twice a spacing between adjacent partially-reflective surfaces of the coupling-out arrangement.

13 Claims, 7 Drawing Sheets

(51) Int. Cl.
  *G02B 6/42* (2006.01)
  *H04N 9/31* (2006.01)
(52) U.S. Cl.
  CPC ......... *H04N 9/3155* (2013.01); *H04N 9/3161* (2013.01); *G02B 2027/0178* (2013.01)

(56) References Cited

U.S. PATENT DOCUMENTS

| | | | | |
|---|---|---|---|---|
| 2005/0180687 A1* | 8/2005 | Amitai | ................... | G02B 6/003 385/31 |
| 2007/0070859 A1* | 3/2007 | Hirayama | .......... | G02B 27/0172 369/112.04 |
| 2009/0122414 A1* | 5/2009 | Amitai | ............... | G02B 27/0172 359/633 |
| 2010/0097671 A1* | 4/2010 | Leister | ................... | G03H 1/08 359/9 |
| 2011/0013245 A1* | 1/2011 | Tanaka | ............... | G02B 27/0172 359/201.2 |
| 2012/0188619 A1* | 7/2012 | Song | .................... | G03H 1/2205 359/9 |
| 2013/0208362 A1* | 8/2013 | Bohn | .................. | G02B 27/017 359/630 |
| 2013/0222384 A1* | 8/2013 | Futterer | ............... | G02B 6/0016 345/426 |
| 2014/0111865 A1* | 4/2014 | Kobayashi | ............. | G02B 5/003 359/633 |
| 2015/0241619 A1* | 8/2015 | Richards | .............. | G02B 6/0015 362/607 |
| 2016/0341964 A1* | 11/2016 | Amitai | ............ | B29D 11/00663 |
| 2017/0075119 A1* | 3/2017 | Schultz | ................ | G02B 6/0038 |
| 2017/0123204 A1* | 5/2017 | Sung | .................. | G02B 27/0103 |
| 2017/0343822 A1* | 11/2017 | Border | ................ | G02B 27/286 |
| 2019/0113825 A1* | 4/2019 | Alexander | ........... | G02B 6/0016 |

\* cited by examiner

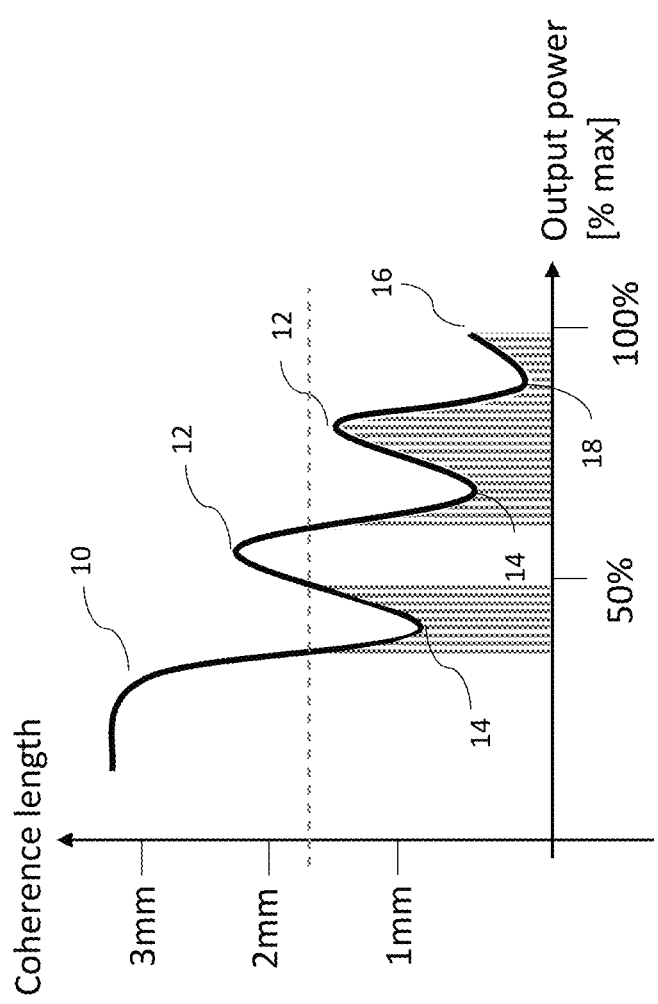

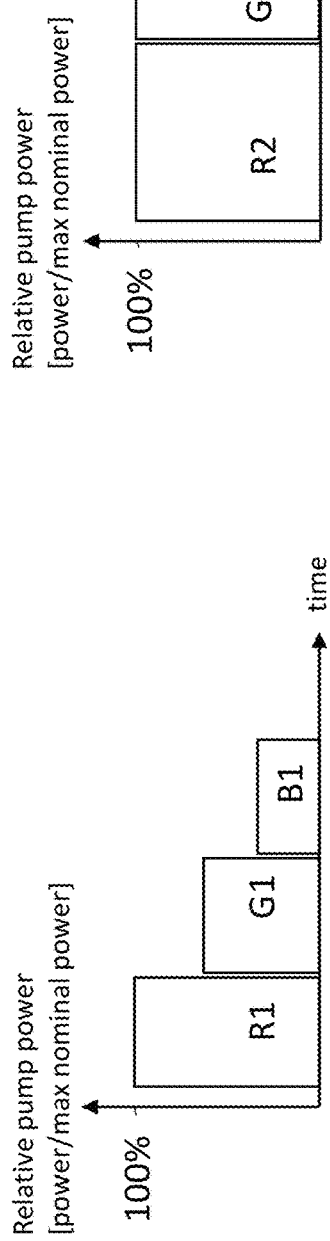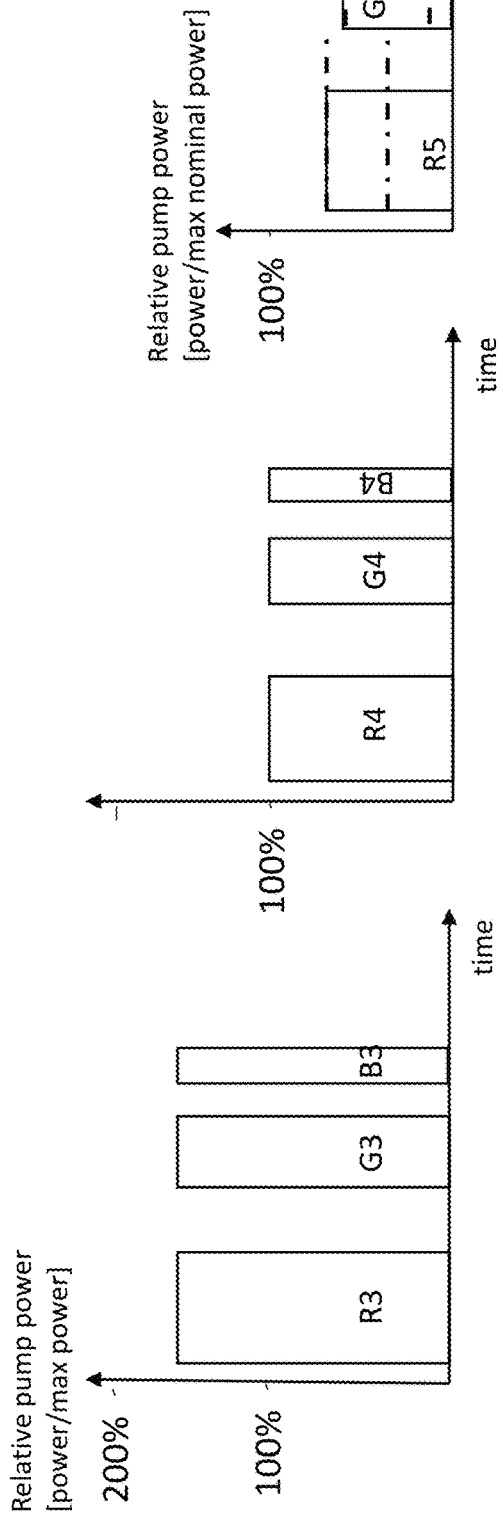

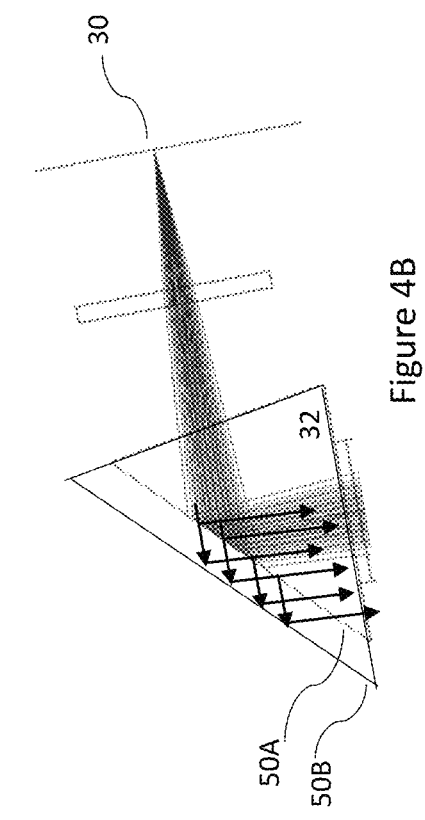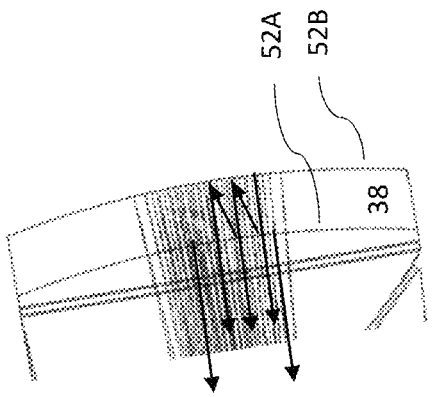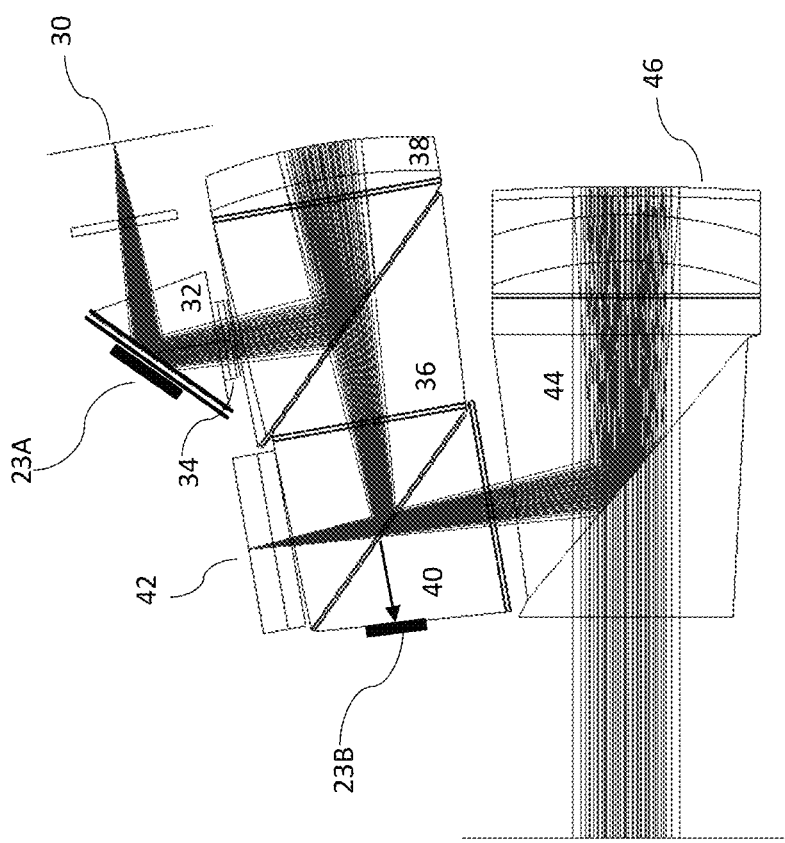
Figure 4B
Figure 4C
Figure 4A

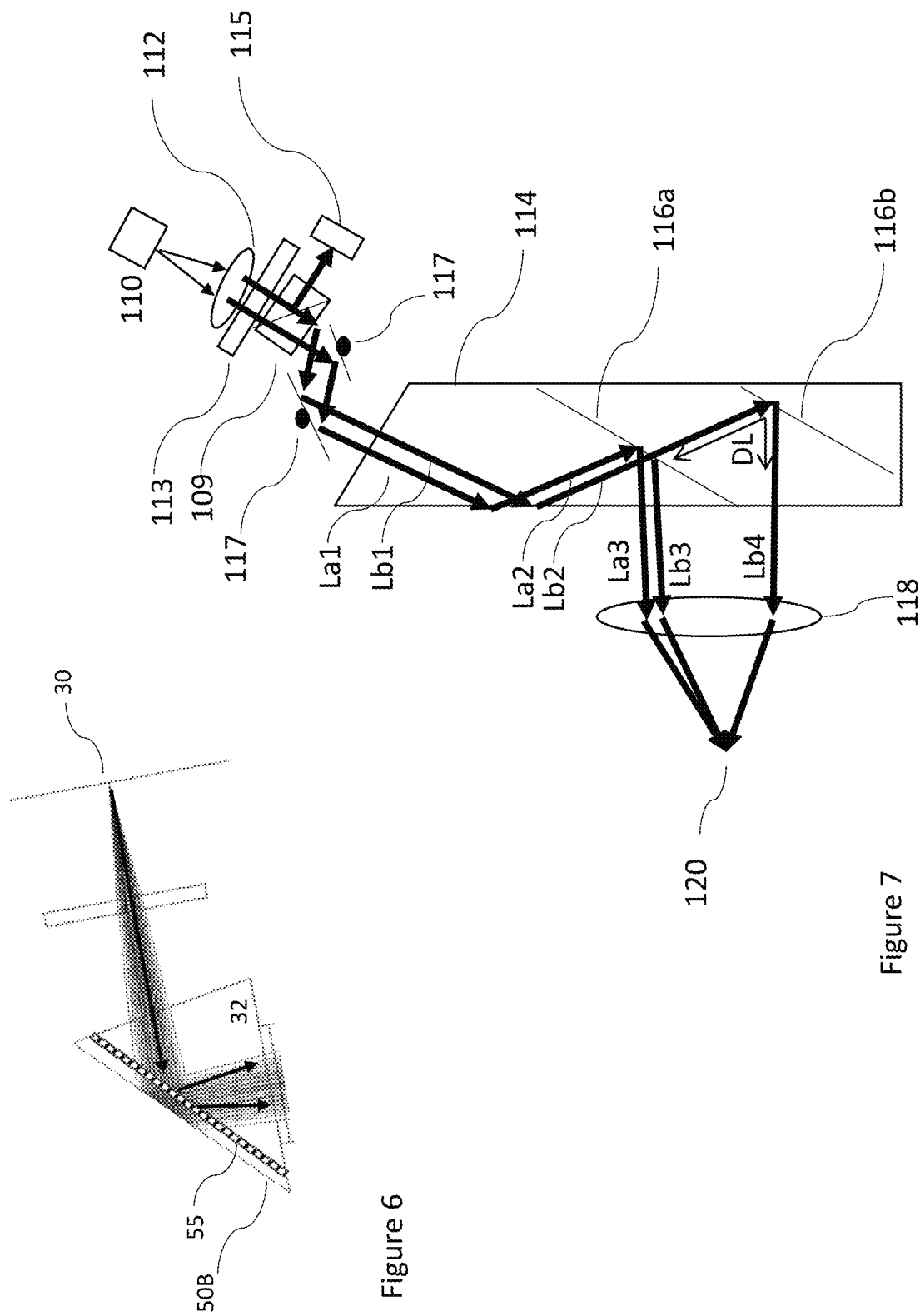

NEAR-EYE DISPLAY WITH LASER DIODE ILLUMINATION

FIELD AND BACKGROUND OF THE INVENTION

This application is a national stage application of PCT/IL2019/051003 filed on Sep. 8, 2019 and incorporated herein by reference in its entirety.

The present invention relates to near-eye displays and, in particular, it concerns near-eye displays in which one or more laser diode is used as the illumination source.

It is known to provide near-eye displays employing a transparent light-guide optical element (LOE) or "waveguide" placed before the eye of the user. An image from an image projector is introduced into the LOE and conveyed within the LOE by internal reflection to the region in front of the user's eye, where the image is coupled out of the LOE by a suitable output coupling mechanism towards the eye of the user. The output coupling mechanism may be based on an array of obliquely-angled partial reflectors or "facets", typically embedded in the LOE, or may employ a diffractive pattern.

The image projector typically employs one of two approaches. According to a first approach, an illumination source illuminates the surface of a spatial light modulator, such as a liquid-crystal-on-silicon (LCOS) chip, which modulates the illumination intensity for each pixel which is transmitted. Alternatively, the intensity of a fine illumination beam may be modulated as it is directed to scans the image pixels to provide the illumination level required for each pixel, thereby forming an image.

A color display is formed by combining three colors: red, green and blue (RGB), each generated by a different light source, in sequence, thereby generating a visual impression of an RGB color image. The relative power of the color lasers is typically set to provide a perception of white color. The maximum power of a system is defined as the maximum white color power.

Laser diodes are potentially advantageous illumination sources for use in an image projector of a near-eye display due to their small form-factor and high output. However, it has been found that the coherence of the light generated by a laser diode tends to give rise to interference-related artefacts, for example, generating observable artefacts known as "speckles", which impact the observed image quality.

SUMMARY OF THE INVENTION

The present invention is a near-eye display.

According to the teachings of an embodiment of the present invention there is provided, a near-eye display for projecting an image to an eye of an observer, the near-eye display comprising: (a) a light-guide optical element (LOE) having first and second major external surfaces that are planar and mutually parallel; (b) an image projector for projecting illumination corresponding to the image, the image projector being optically coupled to the LOE so as to introduce the illumination into the LOE so as to propagate within the LOE by internal reflection at the first and second major external surfaces, the image projector comprising: (i) at least one light-generating laser diode, and (ii) a controller for actuating the laser diode to generate light; and (c) a coupling-out arrangement comprising a plurality of mutually-parallel, partially-reflective surfaces associated with the LOE at an oblique angle to the first major external surface for coupling the illumination out of the LOE towards the eye of the observer, the coupling-out arrangement having a spacing between adjacent surfaces of the plurality of partially-reflective surfaces, wherein the light-generating laser diode has a characteristic variation of coherence length of generated light as a function of diode actuation power, and wherein the controller is configured to actuate the laser diode at a level of diode actuation power that generates light with a coherence length less than twice the spacing.

According to a further feature of an embodiment of the present invention, the controller is configured to vary the level of diode actuation power over at least one range of values that excludes at least one level of diode actuation power corresponding to a maximum of the function.

According to a further feature of an embodiment of the present invention, the controller is configured to vary the level of diode actuation power over at least one range of values for which the coherence length lies below a threshold value.

According to a further feature of an embodiment of the present invention, the level of diode actuation power is proximal to a minimum of the function.

According to a further feature of an embodiment of the present invention, the level of diode actuation power is greater than a maximum nominal power rating of the laser diode.

According to a further feature of an embodiment of the present invention, the plurality of partially-reflective surfaces are located internally within the LOE.

According to a further feature of an embodiment of the present invention, the at least one light-generating laser diode is implemented as at least three light-generating laser diodes generating different colors of visible light.

According to a further feature of an embodiment of the present invention, the at least one light-generating laser diode is deployed to illuminate at least part of a spatial light modulator deployed in an image plane of the image projector.

According to a further feature of an embodiment of the present invention, the controller is configured to implement a brightness adjustment, and where at least part of the brightness adjustment is implemented using pulse-width modulation of pulses of light generated by the laser diode.

According to a further feature of an embodiment of the present invention, the image projector further comprises a scanning arrangement configured for scanning illumination from the laser diode across an image plane of the projector.

According to a further feature of an embodiment of the present invention, the image projector further comprises an electrically-switchable optical attenuator deployed for varying an output intensity of light from the laser diode output from the image projector synchronously with the scanning.

According to a further feature of an embodiment of the present invention, the image projector further comprises a path-multiplying reflector arrangement positioned in a path of light generated by the laser diode, the path-multiplying reflector arrangement comprising a full reflector and at least one partial reflector deployed parallel to the full reflector and spaced from the full reflector by more than half the coherence length.

According to a further feature of an embodiment of the present invention, the image projector further comprises a path-multiplying diffuser arrangement positioned in a path of light generated by the laser diode, the path-multiplying diffuser arrangement comprising a reflector and a diffuser layer deployed parallel to the reflector and spaced from the reflector by more than half the coherence length such that light generated by the laser diode passes through the diffuser layer, is reflected from the reflector, and passes again through the diffuser layer.

BRIEF DESCRIPTION OF THE DRAWINGS

The invention is herein described, by way of example only, with reference to the accompanying drawings, wherein:

FIG. 2C is a graph similar to FIG. 2A illustrating application of a maximum coherence length threshold to define permitted actuation power levels for operation of a laser diode in the near-eye display of FIG. 1;

FIG. 3A is a graph illustrating relative actuation power levels as a function of time for three differently colored laser diodes using equal duration cycle times in order to achieve white balance;

FIG. 3B is a graph similar to FIG. 3A illustrating a corresponding white balance using full power for each laser diode and differing durations of respective cycles for each color;

FIG. 3C is a graph similar to FIG. 3B illustrating the use of 150% power level relative to a nominal maximum power rating to achieve the same perceived output illumination as FIG. 3B;

FIG. 3D is a graph similar to FIG. 3B illustrating 50% perceived illumination level obtained by pulse-width modulation;

FIG. 3E is a graph similar to FIG. 3D illustrating an implementation of 50% perceived illumination obtained by combining selection of discrete preferred power levels for each laser diode together with pulse-width modulation;

FIG. 4A is a side view of an exemplary optical configuration for an image projector of the near-eye display of FIG. 1 based on a spatial light modulator;

FIGS. 4B and 4C are enlarged representations of a prism reflector and a reflective lens, respectively, from FIG. 4A illustrating use of partial reflectors to generate multiple optical paths between the laser diodes and the spatial light modulator;

FIG. 6 is a view similar to FIG. 4B in which a diffuser layer is deployed to generate a multi-path effect; and FIG. 7 is a schematic side view of the optical components of an implementation of the near-eye display of FIG. 1 illustrating an image projector based on modulation of a narrow scanning beam.

DESCRIPTION OF THE PREFERRED EMBODIMENTS

The present invention is a near-eye display.

The principles and operation of near-eye displays according to the present invention may be better understood with reference to the drawings and the accompanying description.
Introduction-Coherence Length Variations In principle, non-coherent illumination would be the preferred alternative for near eye display applications since it produces a smooth image without the non-uniformities called "speckles." Non-coherency is achieved by utilization of spatially and temporally uncorrelated wave-fronts.

The internal wave-front in a laser is called a "mode" that radiate outward from the laser as an output-beam or wave-front. The existence of a specific mode in a laser depends on laser power (more power, more modes) and laser length (each mode exists periodically in specific lengths). These modes typically have a plurality of transverse spatial distributions and wavelengths. The more modes that are active in a laser, the less coherent the output-beam is.

The degree of coherence of laser (or other) radiation can be quantified using a parameter referred to as the "coherence length" of the radiation. The coherence length is the propagation distance over which a coherent wave maintains a specified degree of coherence. Wave interference is strong when the paths taken by all of the interfering waves differ by less than the coherence length. Conversely, if the difference in path lengths of different optical paths which are subsequently combined differ by more than the coherence length, interference effects are typically small.

For a measurable parameter which can be assessed experimentally, the coherence length can be measured using a Michelson interferometer and is the optical path length difference of a self-interfering laser beam which corresponds to a $1/e=37\%$ fringe visibility, where the fringe visibility V is defined as:

$$V = \frac{I_{max} - I_{min}}{I_{max} + I_{min}}$$

where I is the maximum or minimum of the intensity across the fringe pattern.

Laser diodes tend to have relatively short cavities and few active modes, and the actual number of active modes varies as a function of the operating conditions. Consequently, coherence length in diode-lasers typically varies from a few millimeters (or even centimeters) down to less than one millimeter.

Figure 2A:
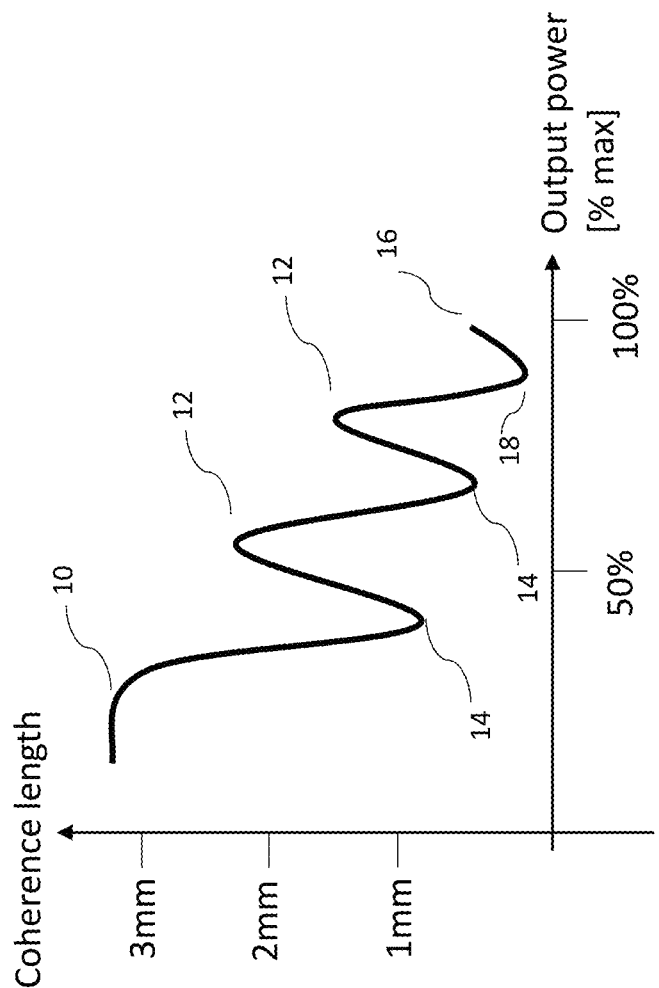
FIG. 2A is a graph illustrating schematically variation of coherence length as a function of output power for a laser diode from the near-eye display of FIG. 1.

Varying the pumping power applied to a laser diode by varying the supplied electrical current changes the effective laser coherence length. FIG. 2A shows an example of coherence length as function of output power (which is monotonically correlated to input pump power).

The coherence length is inversely correlated to the number of active modes in the laser. At low power (region 10), the laser is close to single mode (longitudinal and transverse) operation and coherence length is maximal. As power is increased, more modes become active, giving a general trend of coherence length reduction with increased power. High order modes become active periodically, thereby generating an undulating function superimposed on the general trend of coherence length reduction, as illustrated in the graph. If the conditions are favorable for high order modes then they become active, leading to a local minimum of coherence length as illustrated at points 14. Where the effective cavity length becomes less favorable for these modes, they become inactive and the coherence length increases towards a local maximum 12. This process continues periodically until the highest laser rated power (point 16). The overall characteristic variation of coherence length of generated light generated by the laser diode as a function of diode actuation power can be continuous as shown in FIG. 2A or may have discontinuities.

System Overview

Figure 1:
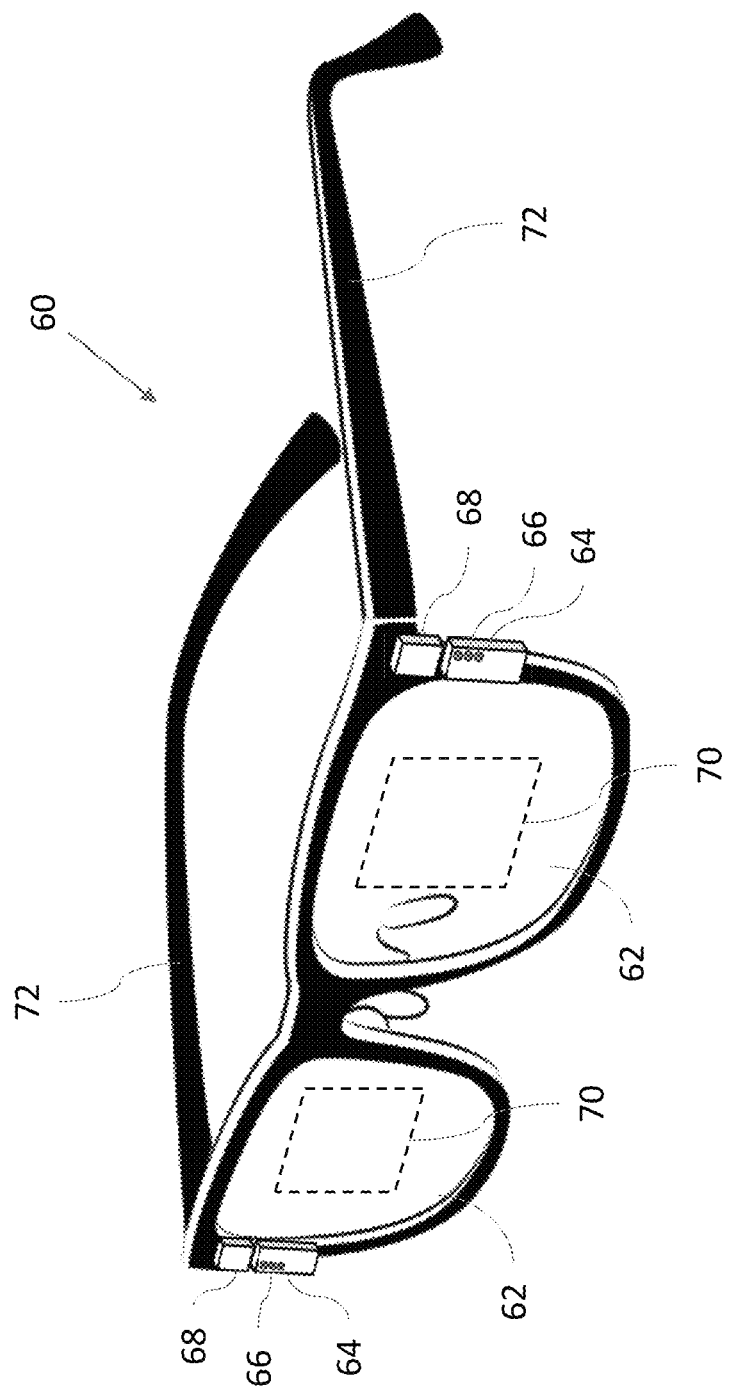
FIG. 1 is a schematic isometric view of a near-eye display, constructed and operative according to an embodiment of the present invention, employing a number of laser diodes as illumination sources.

FIG. 1 illustrates schematically an overview of a near-eye display 60, for projecting an image to an eye of an observer (not shown). The near-eye display includes a light-guide optical element (LOE) or "waveguide" 62 having first and second major external surfaces that are planar and mutually parallel. An image projector 64, projecting illumination corresponding to the image, is optically coupled to LOE 62 so as to introduce the illumination into the LOE so as to propagate within the LOE by internal reflection at the first and second major external surfaces. Optical coupling of image projector 64 to LOE 62 may be achieved by any suitable optical coupling, such as for example via a coupling prism with an obliquely angled input surface, or via a reflective coupling arrangement, via a side edge and/or one of the major external surface of the LOE. Details of the coupling-in configuration are not critical to the invention, and are not shown in this schematic representation.

Image projector 64 includes at least one light-generating laser diode 66, and a controller 68 for actuating the laser diode(s) to generate light, preferably employing electrical power from a small onboard battery (not shown) or some other suitable power source. Image projector 64 typically also includes a spatial light modulator, such as an LCOS chip, deployed in an image plane of the image projector so as to be at least partially illuminated by light from the light-generating laser diode. (If only partially illuminated, full illumination of the LCOS chip is achieved either by use of additional laser diodes or by introducing a scanning motion of the illuminated region across the LCOS, such as is described in co-assigned PCT patent application publication no. WO 2019/111237 A1.) The spatial light modulator modulates the projected intensity of each pixel of the image, thereby generating an image. Alternatively, the image projector may include a scanning arrangement, typically implemented using a fast-scanning mirror, which scans illumination from the laser diode across an image plane of the projector while the intensity of the beam is varied synchronously with the motion on a pixel-by-pixel basis, thereby projecting a desired intensity for each pixel. In both cases, collimating optics are provided to generate an output projected image which is collimated to infinity. Some or all of the above components are typically arranged on surfaces of one or more PBS cube or other prism arrangement, as is well known in the art.

It will be appreciated that controller 68 includes electronic components such as at least one processor or processing circuitry to drive the laser diodes synchronously with actuation of the LCOS or other image generator, or in the scanning laser implementation discussed below, synchronously with a scanning mechanism and any attenuator, all as is known in the art. The controller will thus include all of the relevant driver circuitry, whether implemented as dedicated hardware, an ASIC, a general purpose processor operating under control of suitable software, or any hardware/software/firmware combination, as will be readily understood by a person having ordinary skill in the art.

As mentioned, suitable coupling-in configurations for coupling the image into the LOE, such as by use of a coupling-in reflector or by a suitably angled coupling prism, are well known in the art. Coupling between the image projector and the LOE may be direct, or may be via an additional aperture expanding arrangement for expanding the dimension of the aperture across which the image is injected in the plane of the LOE. Except where stated otherwise, details of both the projector and the coupling-in configuration are generally similar to known configurations commercially available from LUMUS Ltd. (Israel), and for conciseness of presentation, they are represented here only schematically.

The near-eye display also includes a coupling-out arrangement (represented schematically by dashed rectangle 70) deployed for coupling the illumination out of the LOE towards the eye of the observer to be viewed by the observer. The coupling-out arrangement as will be discussed further below with reference to FIG. 7, is typically implemented as a plurality of mutually-parallel, partially-reflective surfaces (or "facets") deployed within LOE 62 at an oblique angle to the major external surfaces. The coupling-out arrangement has a spacing between adjacent surfaces of the plurality of partially-reflective surfaces. The facets typically have angular-dependent coatings to provide high transmission at certain angles and partial reflection at other angles in order to couple out only the desired image (and not its conjugate image). Various implementations of LOE's including such facets are commercially available from LUMUS Ltd. (Israel).

The near-eye displays 60 of the present invention are typically head-mounted displays, and therefore preferably include a support arrangement configured for supporting LOE 62 relative to the head of the observer with second major external surface in facing relation to the eye of the observer. The support arrangement is shown schematically in FIG. 1 as a glasses frame structure including sides 72 for supporting the display relative to the ears of the observer. This is only one of a number of options including also a headband mounted structure and a display associated with a helmet. Details of the support arrangement per se are not critical to the present invention, and will not be described herein in detail. The description herein refers throughout to components of a display suitable for providing an image to one eye of the user or "observer", but is preferably provided for each eye of the user in a stereo-vision arrangement, with a suitable image displayed to each eye, as is known in the art. Other hardware components, such as power supplies, communication subsystems, sensors, input devices etc. are typically added to the near-eye display, all in accordance with the device design and intended application, as will be clear to a person having ordinary skill in the art.

Selective Power Levels for Laser Activation

Figure 2B:
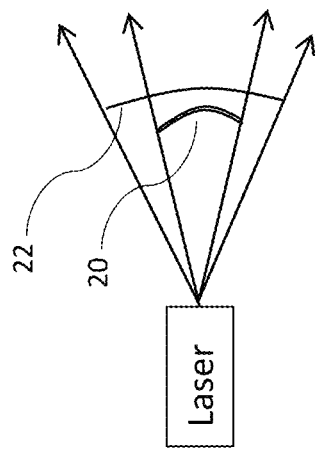
FIG. 2B is a schematic representation of the spatial illumination distribution of a laser diode output for different degrees of coherence of the output beam.

According to an aspect of certain embodiments of the present invention, controller 68 is configured to actuate the one or more laser diode 66 at a level of diode actuation power that generates light with a coherence length sufficiently small to reduce, or eliminate, visible interference-related artifacts in the image observed by the user. Thus, according to one particularly preferred option, controller 68 operates each laser diode 66 at discrete power levels corresponding to one or more minima 14 or the global minimum 18 in the characteristic variation of coherence length of generated light as a function of diode actuation power for each laser diode (e.g., as illustrated in FIG. 2A), thereby minimizing interference-related effects. The local minima and/or the global minimum may be preferred over the maximal output power level 16. At these minimum coherence length points, the image has less speckles noise and spatial illumination distribution is wider as shown in 22 in FIG. 2B (associated with power levels 14 and 18) relative to angular spread 20 (associated with operation at power levels 10 and 12). Intermediate brightness power levels (between the preferred discrete power levels) are achieved by adjusting other components or parameters of the system, such as by scaling the image data on an LCOS, by pulse-width modulation, or by use of an external attenuator (as described with reference to attenuator 113 in FIG. 7, below).

In some cases, visibility of interference-related effects can be eliminated, or sufficiently reduced, by actuating selective power levels that are not specifically selected to correspond to the minima of the coherence-length function but rather proximal to a minimum of the function. In this context, "proximal to a minimum" is preferably defined as lying within a range corresponding to the lower half of the coherence length range between a minimum and the adjacent maximum of the function.

In certain preferred implementations, it is advantageous to implement controller 68 so that the power level of the laser diodes can be varied continuously (i.e., through multiple closely spaced levels) over one or more permitted range of values that excludes at least one level of diode actuation power corresponding to a maximum of said function.

Alternatively, the permitted range of values may advantageously be defined by a range of values for which the coherence length lies below a particular threshold value. FIG. 2C illustrates application of a coherence length threshold to the coherence length function of FIG. 2A. The regions falling below the threshold are shaded, and define the ranges of permissible power levels at which controller 68 can operate laser diode 66 according to this approach.

By way of one particularly preferred example, if the coherence length is kept to less than twice the spacing between adjacent partially-reflective surfaces of the coupling-out configuration, interference effects such as speckles are typically eliminated, or at least reduced to acceptable levels at which they are not disturbing to the user.

The graph of FIG. 2A may vary as result of laser heat-sink temperature. In certain cases, it may be sufficient to calibrate the system for typical operating temperatures. In some particularly preferred implementations, a temperature sensor is employed to provide an input to the controller, and the preferred power levels or permitted power level ranges are determined from a temperature calibration chart (either parametrically defined or a look-up table).

Alternatively, a spatial sensor can be used in to detect the actual spatial noise of the laser and set drive power to minimal spatial noise. Examples of suitable locations for such a sensor in particular exemplary implementations are shown as elements 23A and 23B in FIG. 4A and element 115 in FIG. 7.

It is noted that the coherence length to power function such as in FIG. 2A is specific to each laser diode, and may vary considerably in both values and in form. As a result, when dealing with a system having multiple sources (such as an RGB color display), the power level management is performed for each laser diode according to its particular characteristics. In some cases, one or more of the diodes may have sufficiently short coherence lengths over the entire operating range of power levels that no restrictions need to be applied, while another diode may need to be operated within a very limited range of power levels. In certain cases, particularly where the coherence length is above a desired threshold value over the normal power level operating range, it may be preferable to operate one or more of the laser diodes at a power greater than a maximum nominal power rating of the laser diode, for example at 150% power, in order to reach reduced coherence length conditions. The maximum power rating can typically be exceeded for short periods without damage to the laser diode so long as the time-averaged power output remains below the rated value.

Spatial Light Modulator Implementations

In a first subset of implementations, the laser diode flood-illuminates a spatial light modulator, such as an LCOS chip, which serves as an image generator. Laser average power determines the overall brightness of the brightest pixel of the LCOS as perceived by the observer. Color is generated by sequential illumination using different colors.

The limitations described thus far regarding the operating power of each laser diode to avoid speckles must be reconciled with the need to achieve continuous gray-scale levels from all laser colors (red, green and blue), and the power of the light sources must be calibrated in order to obtain white illumination into the observer at maximum projecting power.

In order to achieve white balance, the color sources operating in sequence are normally activated at different relative power as shown in FIG. 3A. In many cases, the red source has low max power, and is therefore operated at maximal power R1, while the other sources (G1, B1) activate at lower power to achieve white balance. When operated in this way, the maximum output power of the system is reduced relative to operation of each source at full power. (This is only an example, and colors other than red may be the "bottleneck" of the white output power depending on source power and spectral transmittance of the optical system.)

As a preferred alternative, white balance can be achieved in color-sequence operation by modification of the time slot of each color-source as shown in FIG. 3B. In the example the red time slot is substantially larger R2 and the other color sources are appropriately modified (G2, B2) so they each operates at maximal output power.

For example, if in an equal time period sequence (FIG. 3A) white balance was achieved at R1_power=100%, R2_power=66% and B1_power=33%, then at modified time slot the timing will be R2_timing=50%, G2_timing=33% and B2_timing=16%. Consequently, the total output power will increase by 50%.

Lasers are limited in average total output power. Exceeding this limitation will cause damage to the laser. FIG. 3C shows an activation scheme according to an aspect of an embodiment of the present invention in which peak intensity increased to 150% while maximal average power is maintained by shortening pulse duration by $\frac{2}{3}$. Consequently, laser maximal power in not exceeded but during operation, more modes are activated and the output beam is less coherent, as required. In this process, some efficiency is sacrificed since high order modes in a laser diode tend to have more internal loss. Laser power limitation can be non-linear between peak power and pulse duration, and the limit should not be exceeded.

In order to vary the overall image brightness without compromising the above limitations on permitted power levels for operating the laser diodes, power reduction can advantageously be achieved using pulse width modulation (PWM). For simple system management, the time slots for white balance are set constant. FIG. 3D illustrates a reduced illumination level by reducing illumination time within each time slot. In this example, activation time of the sources was reduced by half in order to generate half system brightness (relative to 3B) while maintaining illumination quality by employing an illumination power corresponding to minimum coherence length point 18 in FIG. 2A.

FIG. 3E shows a modification of this approach in which the PWM approach is combined with the use of a number of discrete preferred power levels available for each laser diode. In this figure, the color-sequenced output is set to be 50% as in 2D. In this example, the dot-dashed lines represent the preferred power levels of the lasers (empirically determined, different for each laser, and preferably corresponding to points such as 14 and 18 of FIG. 2A for each laser diode). The power level selected is the lowest possible while the fine power adjustment is achieved by the illumination time of each color laser.

Multi-Path for Coherence Reduction

Even where precautions are taken to reduce the coherence length as described above, interference effects may still occur wherever multiple optical paths have a path difference shorter than the coherence length. This may occur, for example, at diffusers and other thin optical elements such as wave-plates (required for polarization management in a polarized beam splitter), where illumination is reflected from both the front and back surfaces of a thin element. According to a further preferred feature of certain implementations of the present invention, these interference patters are further reduced by splitting the laser wave-front to non-coherent sub-wave-fronts. Each of these sub-wave-fronts has a different optical path that differs by more than the coherence length of the wave-front.

FIG. 4A shows an optical image projector having separate illumination and imaging optical paths. Other similar systems having overlapping optical paths of illumination and imaging are also relevant, but this spatially-separated configuration has been chosen for the illustration for the sake of clarity.

Laser 30 transmits diverging rays onto prism 32. The reflected rays pass through diffuser 34 that disperses the rays to illuminate the entirety of image generator (LCOS) 42 (dispersed rays not shown for clarity). After diffuser 34, the PBS (polarized beam splitter) 36 diverts the transmitted rays onto reflecting optics 38 that focus the rays onto LCOS 42. The reflected rays pass through PBS 40 and PBS 44 to be collimated by reflector 46 onto the entrance 48 to a waveguide (not shown). This entrance is the stop of the optical system. Illumination efficiency is preferably optimized by making the diffuser 34 a conjugate image plane with 48. Quarter-wave plates are provided in front of optics 38 and 46 to convert the polarization in order to achieve the required reflection or transmission through the PBS, as is known in the art. Non-uniformity sensing can be performed by placing spatial sensors (pixel sensors) at optical path having residues of illumination. For example at 23A or preferably at 23B where diffuser 34 phase pattern is converted to an intensity pattern.

According to an aspect of certain embodiments of the present invention, speckles are reduced by generation of multiple paths in the illumination optical section (defined from the laser diode to the LCOS). FIG. 4B shows one implementation in which prism 32 includes two reflecting surfaces: 50A is partial reflector and 50B is preferably a full (100%) reflector. As shown by the arrows in this figure, part of the light is reflected by 50A, part by 50B and part after multiple reflections between the two surfaces. Preferably, the optical path back and forth between these reflectors (considering refractive index and propagation angle) is larger than the coherence length of the illuminating laser as previously described. In certain cases, this will require the spacing between 50A and 50B to be at least about 1 mm. The few mutually incoherent reflections illuminate the diffuser and other components to generate different non-uniformities patterns. The patterns are incoherently combined therefore providing a visual impression corresponding to an average of the random non-uniformities as square root weighted averaging of the individual reflections. By introducing more partially reflective planes to 50A more reflections are generated and speckle noise is further reduced. FIG. 4C illustrates an alternative implementation of this concept where a curved (concave) partial reflector 52A is included parallel to a curved (concave) full reflector 52B of the reflective optics 38. This operates by the same principles as FIG. 4B, but where multiple internal reflections experience opposite (convex) optical power when reflecting from the rear surface of 52A, thereby ensuring that the net optical power applied to all reflections remains the same as a single reflection from one of the concave surfaces.

Figure 5B:
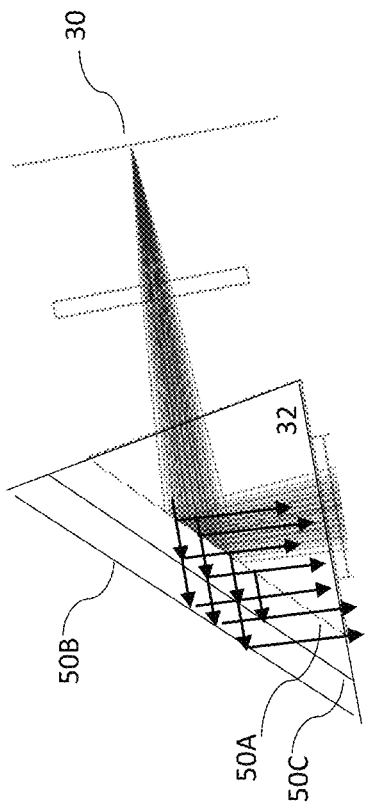
FIG. 5B is a view similar to FIG. 4B showing a modification of FIG. 4B in which multiple partial reflectors are used.
Figure 5A:
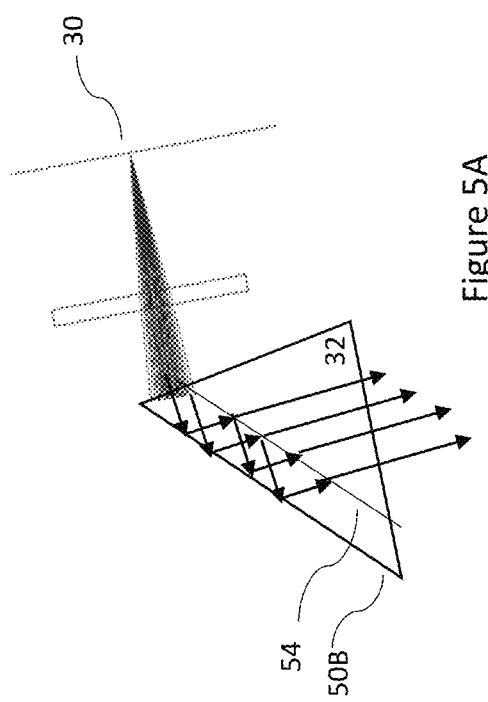
FIG. 5A is a view similar to FIG. 4B illustrating injection of light from the laser diodes between two reflectors.

FIG. 5A shows a variation of FIG. 4B where the light from source 30 is introduced between the external 100% reflective plane 50B and the internal partially reflective plane 54. In this configuration the reflectivity of plane 54 is high thereby more incoherent reflections are generated. The injected light can be collimated and the planes 54 and 50B may not be parallel thereby improving generated wave-front uniformity. The output coupling from between the layers 54 and 50B can be by using parallel partial reflectors termed "facets".

FIG. 5B shows another variation of FIG. 4B where more planes are included. Plane 50B is 100% reflector and the other planes are partially reflecting (50A and 50C). More reflecting planes enable generation of more incoherent wave-fronts, thereby further reducing speckle noise.

The partial reflectivity of the described interim reflector can be designed to be wavelength selective and angle selective by proper coating design. Speckles are most probable to be visible in longer wavelength therefore higher reflectivity is preferred at red color. If lateral spread is a limit then the reflectivity can be designed to be lower at higher angles.

FIG. 6 shows another configuration to reduce speckle noise. In this configuration, the diffuser 34 is relocated as 55 close to the 100% reflector 50B. The angular spread of the diffuser 55 should be such that two passes through it generates equivalent light spread as diffuser 34 (practically one over square root of the spread). The distance between diffuser 55 and reflecting face 50B should be larger than the coherence length. Preferably, the optics 38 (FIG. 4A) is modified to generate the image of the stop 48 on the reflector plane 50B. This configuration generates incoherent averaging of speckles and non-uniformity thereby improving image quality.

Scanning Laser Illumination

As mentioned above, an alternative approach to generating an image for near eye displays employs a laser scanning configuration in which a narrow beam is scanned to generate the image. In this case, a continuous variation of laser power is required. It is preferable to achieve this while maintaining short coherence length. FIG. 7 illustrates an approach to how this can be achieved.

FIG. 7 describes a laser source 110 being collimated by lens 112 to generate collimated light beam. Here the beam is schematically shown as two mutually coherent (having the same phase) light beams La1 and Lb1. According to certain particularly preferred implementations of an aspect of the invention, the light beam passes through variable attenuator 113. In certain implementations, it also passes through a beam splitter 109, preferably with a partially reflecting beam splitter with a low proportion of reflection, and the diverted beam passes onto a power detector 115. The transmitted beams are then reflected by high speed scanning mirrors 117, typically implemented using MEMS technology, and then enter waveguide 114 to be reflected by total internal reflection. The reflected beams are marked as beams La2 and Lb2. As these two rays impinge on partial reflector plane 116*a* they are partially reflected as rays La3 and Lb3. Since surface 116*a* is planar, these two rays continue to be coherent relative to each other. Consequently, lens 118 (representing observer eye) focuses the rays onto spot 120 (the retina). Since La3 and Lb3 are coherent with each other than in spot 120 they will generate constructive interference.

Part of ray Lb2 is transmitted by partial reflector plane 116*a* and continues to reflect from facet 116*b* as ray Lb4. This ray is also focused by lens 118 onto point 120. The distance between facets 116*a* and 116*b* is not accurately set to within fraction of a wavelength. Therefore, the interference of Lb4 with Lb3 and La3 is undefined. The optical path difference of Lb4 and Lb3 is marked as DL, but for a range of different fields can be roughly approximated as twice the spacing between the partially reflecting surfaces. According to the principles of an implementation of the invention as discussed above, the actuation power level of the laser is preferably chosen to ensure that the coherence length will be less than DL. Consequently, maximal possible laser efficiency is achieved without generating interference between light reflected from the various facets.

In the description of FIG. 7, only two partially reflecting surfaces 116*a* and 116*b* are shown for simplicity of presentation. Typically, in practical implementations, many more facets are used, all being planar and parallel. Where non-uniform spacing is used, the threshold for the coherence length is preferably set according to the minimum of the partially reflecting surface spacing.

A number of approaches may be adopted to achieving the power modulation of the beam during scanning of the laser. Where a sufficiently high speed attenuator 113 is available, such as certain interferometric high-speed switchable attenuators, the power of laser 110 may be set to one of the discrete values corresponding to points 14 or 18 from FIG. 2A, or switched rapidly between those values, and the fast optical attenuator may be used to provide the intermediate light power levels. Where a continuous range of laser diode actuation power levels is available, as described in FIG. 2C, variation of the laser diode actuation power level is preferably used for the rapidly varying pixel intensity values, while attenuator 113 may be used to transpose the permitted range of intensities to a lower part of the output intensity range, either for the entire image or for regions of pixels within an image. In this case, suitable variable optical attenuators can be implemented using LCD elements.

Additionally, or alternatively, where a pixel intensity value required for a certain pixel falls in a prohibited (i.e., above-threshold coherence length) region of the actuation power level, an acceptable visual effect may be achieved by illuminating that pixel alternately in successive frames (of the relevant color) with permissible power levels falling below and above the "correct" level, so that the overall pixel intensity as integrated by the observer's eye approximates to the desired pixel intensity. In some cases, the intensity below the correct level may be zero, meaning that the pixel may be illuminated with higher intensity in one frame and then left dark in the next frame.

The power from the laser is preferably monitored by power meter 115 which provides the detected intensity to the controller (not shown here) for calibration. The result of this arrangement is a highly effective laser scanning image projector with low coherence length and continuously varying power.

To the extent that the appended claims have been drafted without multiple dependencies, this has been done only to accommodate formal requirements in jurisdictions which do not allow such multiple dependencies. It should be noted that all possible combinations of features which would be implied by rendering the claims multiply dependent are explicitly envisaged and should be considered part of the invention.

It will be appreciated that the above descriptions are intended only to serve as examples, and that many other embodiments are possible within the scope of the present invention as defined in the appended claims.

What is claimed is:

1. A near-eye display for projecting an image to an eye of an observer, the near-eye display comprising:
   (a) a light-guide optical element (LOE) having first and second major external surfaces that are planar and mutually parallel;
   (b) an image projector for projecting illumination corresponding to the image, said image projector being optically coupled to said LOE so as to introduce the illumination into said LOE so as to propagate within said LOE by internal reflection at said first and second major external surfaces, said image projector comprising:
      (i) at least one light-generating laser diode, and
      (ii) a controller for actuating said laser diode to generate light; and
   (c) a coupling-out arrangement comprising a plurality of mutually-parallel, partially-reflective surfaces associated with said LOE at an oblique angle to said first major external surface for coupling the illumination out of said LOE towards the eye of the observer, said coupling-out arrangement having a spacing between adjacent surfaces of said plurality of partially-reflective surfaces,
   wherein said light-generating laser diode has a characteristic variation of coherence length of generated light as a function of diode actuation power, and wherein said controller is configured to actuate said laser diode at a level of diode actuation power that generates light with a coherence length less than twice said spacing.

2. The near-eye display of claim 1, wherein said controller is configured to vary said level of diode actuation power over at least one range of values that excludes at least one level of diode actuation power corresponding to a maximum of said function.

3. The near-eye display of claim 1, wherein said controller is configured to vary said level of diode actuation power over at least one range of values for which said coherence length lies below a threshold value.

4. The near-eye display of claim 1, wherein said level of diode actuation power is proximal to a minimum of said function.

5. The near-eye display of claim 1, wherein said level of diode actuation power is greater than a maximum nominal power rating of said laser diode.

6. The near-eye display of claim 1, wherein said plurality of partially-reflective surfaces are located internally within said LOE.

7. The near-eye display of claim 1, wherein said at least one light-generating laser diode is implemented as at least three light-generating laser diodes generating different colors of visible light.

8. The near-eye display of claim 1, wherein said at least one light-generating laser diode is deployed to illuminate at least part of a spatial light modulator deployed in an image plane of said image projector.

9. The near-eye display of claim 1, wherein said controller is configured to implement a brightness adjustment, and where at least part of said brightness adjustment is implemented using pulse-width modulation of pulses of light generated by said laser diode.

10. The near-eye display of claim 1, wherein said image projector further comprises a scanning arrangement configured for scanning illumination from said laser diode across an image plane of said image projector.

11. The near-eye display of claim 10, wherein said image projector further comprises an electrically-switchable optical attenuator deployed for varying an output intensity of light from said laser diode output from said image projector synchronously with said scanning.

12. The near-eye display of claim 1, wherein said image projector further comprises a path-multiplying reflector arrangement positioned in a path of light generated by said laser diode, said path-multiplying reflector arrangement comprising a full reflector and at least one partial reflector deployed parallel to said full reflector and spaced from said full reflector by more than half said coherence length.

13. The near-eye display of claim 1, wherein said image projector further comprises a path-multiplying diffuser arrangement positioned in a path of light generated by said laser diode, said path-multiplying diffuser arrangement comprising a reflector and a diffuser layer deployed parallel to said reflector and spaced from said reflector by more than half said coherence length such that light generated by said laser diode passes through said diffuser layer, is reflected from said reflector, and passes again through said diffuser layer.

* * * * *